(12) United States Patent
Shida et al.

(10) Patent No.: US 11,233,491 B2
(45) Date of Patent: Jan. 25, 2022

(54) DISTORTION IMPARTING DEVICE AND DISTORTION IMPARTING METHOD

(71) Applicant: Roland Corporation, Shizuoka (JP)

(72) Inventors: Mitsuo Shida, Shizuoka (JP);
Toshiyuki Ochi, Shizuoka (JP);
Yoshinobu Morimoto, Shizuoka (JP);
Kosuke Takada, Shizuoka (JP)

(73) Assignee: Roland Corporation, Shizuoka (JP)

( * ) Notice: Subject to any disclaimer, the term of this patent is extended or adjusted under 35 U.S.C. 154(b) by 167 days.

(21) Appl. No.: 16/677,586

(22) Filed: Nov. 7, 2019

(65) Prior Publication Data
US 2020/0153400 A1   May 14, 2020

(30) Foreign Application Priority Data

Nov. 9, 2018 (JP) .............................. JP2018-211790

(51) Int. Cl.
| | | |
|---|---|---|
| *H03F 1/12* | (2006.01) | |
| *H03G 3/30* | (2006.01) | |
| *H03F 3/21* | (2006.01) | |
| *H03G 1/00* | (2006.01) | |
| *H04R 3/00* | (2006.01) | |

(52) U.S. Cl.
CPC .............. *H03G 3/3005* (2013.01); *H03F 1/12* (2013.01); *H03F 3/211* (2013.01); *H03G 1/0017* (2013.01); *H04R 3/00* (2013.01); *H03F 2200/03* (2013.01); *H03G 2201/106* (2013.01)

(58) Field of Classification Search
CPC .............. H03G 3/3005; H03G 1/0017; H03G 2201/106; H03F 1/12; H03F 3/211; H03F 2200/03; H04R 3/00; G10H 2210/311; G10H 3/187; G10H 1/16

USPC ............... 330/284, 207 A, 209 P, 297, 207 P
See application file for complete search history.

(56) References Cited

U.S. PATENT DOCUMENTS

2013/0136278 A1    5/2013   Quilter

FOREIGN PATENT DOCUMENTS

| ES | 2319955 | 5/2009 |
|---|---|---|
| GB | 2103004 | 2/1983 |
| JP | H0865062 | 3/1996 |
| WO | 8807787 | 10/1988 |
| WO | 03077232 | 9/2003 |

OTHER PUBLICATIONS

"Search Report of Europe Counterpart Application", dated Mar. 20, 2020, pp. 1-7.
"Office Action of Europe Counterpart Application", dated Feb. 10, 2021, p. 1-p. 6.

*Primary Examiner* — Khanh V Nguyen
*Assistant Examiner* — Khiem D Nguyen
(74) *Attorney, Agent, or Firm* — JCIPRNET

(57) ABSTRACT

A distortion imparting device capable of obtaining a natural distortion effect even when output is decreased is provided. The distortion imparting device includes a first amplification part which attenuates an input audio signal on the basis of an attenuation factor set by a user and amplifies the attenuated audio signal, a second amplification part serially connected to the first amplification part, and a limiting part which is connected between an output terminal of the first amplification part and an input terminal of the second amplification part and limits an input voltage of the second amplification part to a predetermined clip voltage, wherein the limiting part determines the clip voltage on the basis of the attenuation factor.

18 Claims, 4 Drawing Sheets

DISTORTION IMPARTING DEVICE AND DISTORTION IMPARTING METHOD

CROSS REFERENCE TO RELATED APPLICATIONS

This application claims the priority benefit of Japanese Patent Application No. 2018-211790, filed on Nov. 9, 2018. The entirety of the above-mentioned patent application is hereby incorporated by reference herein and made a part of this specification.

BACKGROUND

Technical Field

The disclosure relates to a device for providing a distortion effect to an audio signal.

Description of Related Art

In the music field, a solid state amplifier which can switch output levels is known. Such an amplifier can adjust an output level by attenuating an input signal of a power amplifier provided to the final stage. This function is called a power control function. In this method, it is necessary to add musical effects (e.g., distortion and the like) in a stage before a signal is input to the power amplifier.

On the other hand, even in a solid state amplifier, there is a demand for acquisition of distorted tones as in a vacuum-tube amplifier. The vacuum-tube amplifier can obtain a distinctive overdrive effect by being driven at high output. However, a solid state amplifier cannot obtain the overdrive effect even when a drive voltage is increased unlike the vacuum-tube amplifier. As a technology related to this, Patent Document 1 discloses a solid state amplifier capable of adding distortion as in a vacuum-tube amplifier by using a circuit which limits a voltage.

Patent Documents

[Patent Document 1] Japanese Patent Laid-Open No. H08-065062

However, in the amplifier disclosed in Patent Document 1, it is impossible to maintain distortion when the level of an input signal is decreased because a limit value of the voltage limiting circuit is constant. Although it is desirable that a guitar amplifier be able to set a plurality of attenuation factors in accordance with performance scenes such as studios and stages, the same distortion effect irrespective of output levels cannot be obtained in the conventional technology.

The disclosure provides a distortion imparting device capable of obtaining a natural distortion effect even though an output is decreased.

SUMMARY

A distortion imparting device of the disclosure includes: a first amplification part which attenuates an input audio signal on the basis of an attenuation factor set by a user and amplifies the attenuated audio signal; a second amplification part serially connected to the first amplification part; and a limiting part which is connected between an output terminal of the first amplification part and an input terminal of the second amplification part and limits an input voltage of the second amplification part to a predetermined clip voltage, wherein the limiting part determines the clip voltage on the basis of the attenuation factor.

In addition, a distortion imparting method according to the disclosure, performed by a distortion imparting device which provides a distortion effect to an audio signal, includes: an attenuation step of attenuating an input audio signal on the basis of an attenuation factor set by a user; a first amplification step of amplifying the attenuated audio signal; a limiting step of limiting a voltage of the audio signal amplified in the first amplification step to a clip voltage; and a second amplification step of amplifying the limited audio signal, wherein the clip voltage is determined on the basis of the attenuation factor in the limiting step.

DESCRIPTION OF THE EMBODIMENTS

First Embodiment

Hereinafter, a preferred embodiment will be described with reference to the drawings. However, an embodiment described below can be appropriately modified according to system configurations and various conditions and is not limited to the illustrated form.

An effect providing device according to a first embodiment is a device (distortion imparting device) which provides a sound effect (distortion effect) to an input audio signal, amplifies the audio signal and outputs the amplified audio signal.

Figure 1:
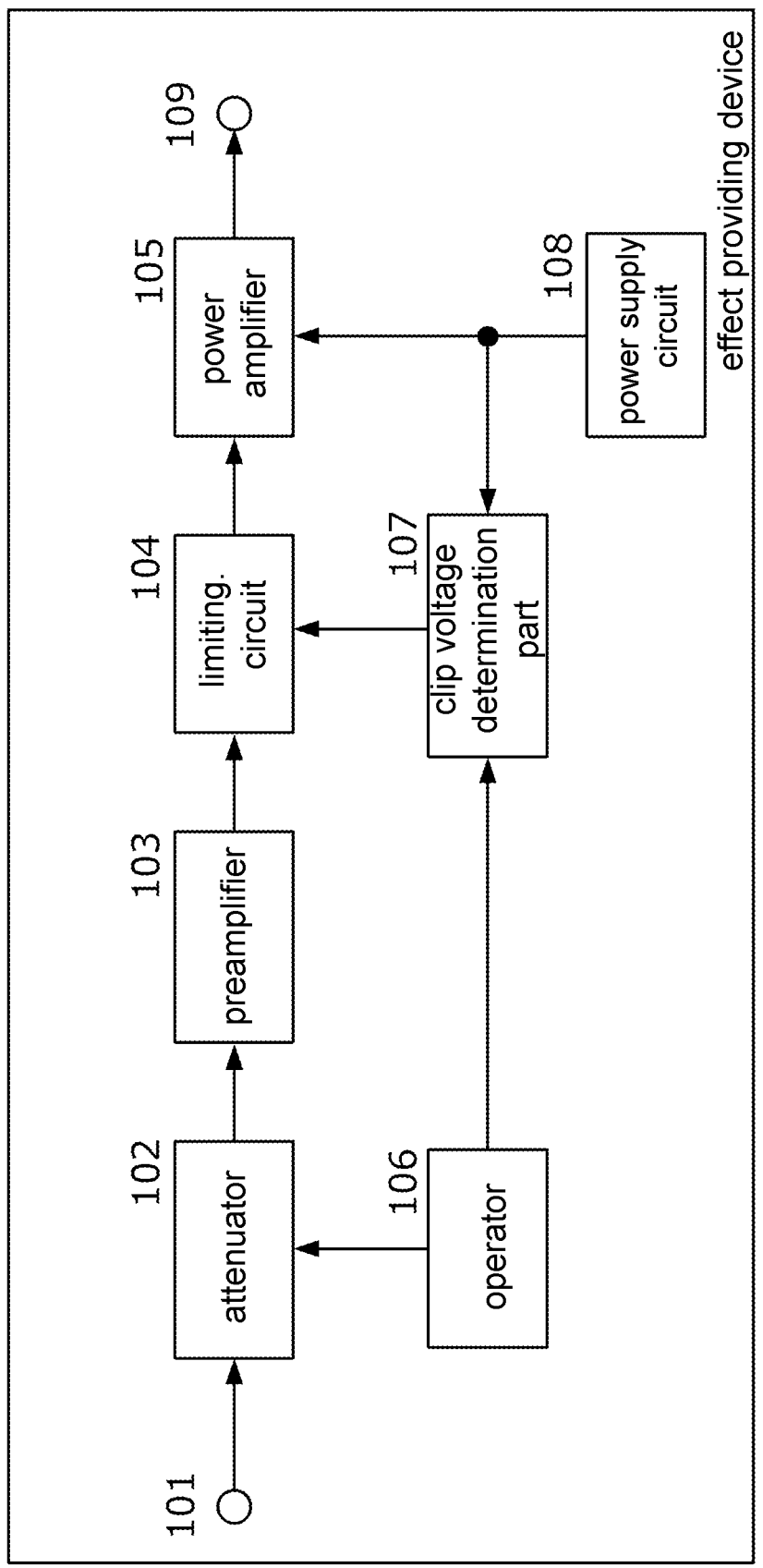
FIG. 1 is a configuration diagram of an effect providing device 10 according to a first embodiment.

A configuration of the effect providing device 10 according to the embodiment will be described with reference to FIG. 1.

The effect providing device 10 includes an audio input terminal 101, an attenuator 102, a preamplifier 103, a limiting circuit 104, a power amplifier 105, an operator 106, a clip voltage determination part 107, a power supply circuit 108, and an audio output terminal 109.

The audio input terminal 101 is a terminal through which an audio signal is input. In the embodiment, an audio signal converted into an analog signal is input to the audio input terminal 101. The input audio signal is amplified through the preamplifier 103 and the power amplifier 105 and is output from the audio output terminal 109.

The attenuator 102 attenuates the level of an input audio signal according to conditions designated by the operator 106 (which will be described later). For example, a user designates an attenuation factor in accordance with a play environment such as a studio, a stage or a house and the level of an audio signal is attenuated in response to the attenuation factor (also referred to as power control).

The preamplifier 103 is a circuit which performs adjustment and amplification on an input audio signal. Level adjustment, equalizing, balance adjustment and the like of an audio signal can be performed through the preamplifier 103. Meanwhile, the preamplifier 103 may simulate a specific vacuum tube.

The attenuator 102 and the preamplifier 103 are exemplarily regarded as a first amplification part. Meanwhile, although the attenuator 102 and the preamplifier 103 are independent from each other in the embodiment, the function of the attenuator 102 may be integrated into the preamplifier 103.

The limiting circuit 104 limits the voltage of an audio signal input to the power amplifier 105. Specifically, when the level of the audio signal reaches a threshold value of a voltage set in the limiting circuit 104, a signal level at the input terminal of the power amplifier 105 is suppressed. In other words, the level of an audio signal output from the preamplifier 103 and input to the power amplifier 105 is clipped (limited) by the limiting circuit 104. Accordingly, it is possible to simulate the overdrive effect of a vacuum-tube amplifier. The threshold value of the voltage used by the limiting circuit 104 is determined on the basis of a voltage determined by the clip voltage determination part 107 which will be described later. A method for determining the voltage will be described in detail later.

The power amplifier 105 is an audio amplifier (power amplifier) which amplifies an input audio signal to a level suitable to drive a speaker and outputs the amplified audio signal. The power amplifier 105 is exemplarily regarded as a second amplification part, and the limiting circuit 104 is serially connected between the output terminal of the preamplifier 103 and the input terminal of the power amplifier 105.

The operator 106 is an interface which designates an attenuation factor of an audio level. For example, the operator 106 can designate and select any attenuation factor through a push button switch or the like.

The clip voltage determination part 107 is a circuit which determines a reference value (clip voltage) of a voltage when the limiting circuit 104 limits an input signal. The limiting circuit 104 is a circuit which generates the overdrive effect of a vacuum-tube amplifier, as described above. The limiting circuit 104 and the clip voltage determination part 107 are exemplarily regarded as a limiting part.

The effect providing device 10 according to the embodiment can change the power control, that is, select an attenuation amount of an input signal. In the embodiment, a clip voltage is caused to follow power control to be dynamically changed. Accordingly, distortion can be generated at the same point in input audio even when power control (that is, an attenuation amount of an input signal) is changed.

However, when an input signal is amplified to a high power suitable for speaker output through a power amplifier, a voltage supplied to the power amplifier varies according to variation in a load applied to a power supply. Here, in order to obtain special effects of the vacuum-tube amplifier in which an appearance of distortion effect changes according to voltage variation, it is desirable to cause the clip voltage to follow a power supply voltage supplied to the power amplifier.

In the embodiment, the clip voltage determination part 107 determines a clip voltage on the basis of both of (1) power control designated by a user and (2) a power supply voltage supplied to the power amplifier 105. According to this configuration, it is possible to obtain the same tone change effect irrespective of designation of power control. Further, it is possible to reproduce distortion effect change caused by load variation in the power supply.

Meanwhile, the clip voltage in the description is a reference value and the limiting circuit 104 uses a value corrected on the basis of the clip voltage as an actual voltage limiting value. Details will be described later.

The power supply circuit 108 is a circuit which supplies power for driving the power amplifier 105. The power supply circuit 108 may supply power for driving components other than the power amplifier 105.

The audio output terminal 109 is an interface which outputs an amplified audio signal.

Figure 2:
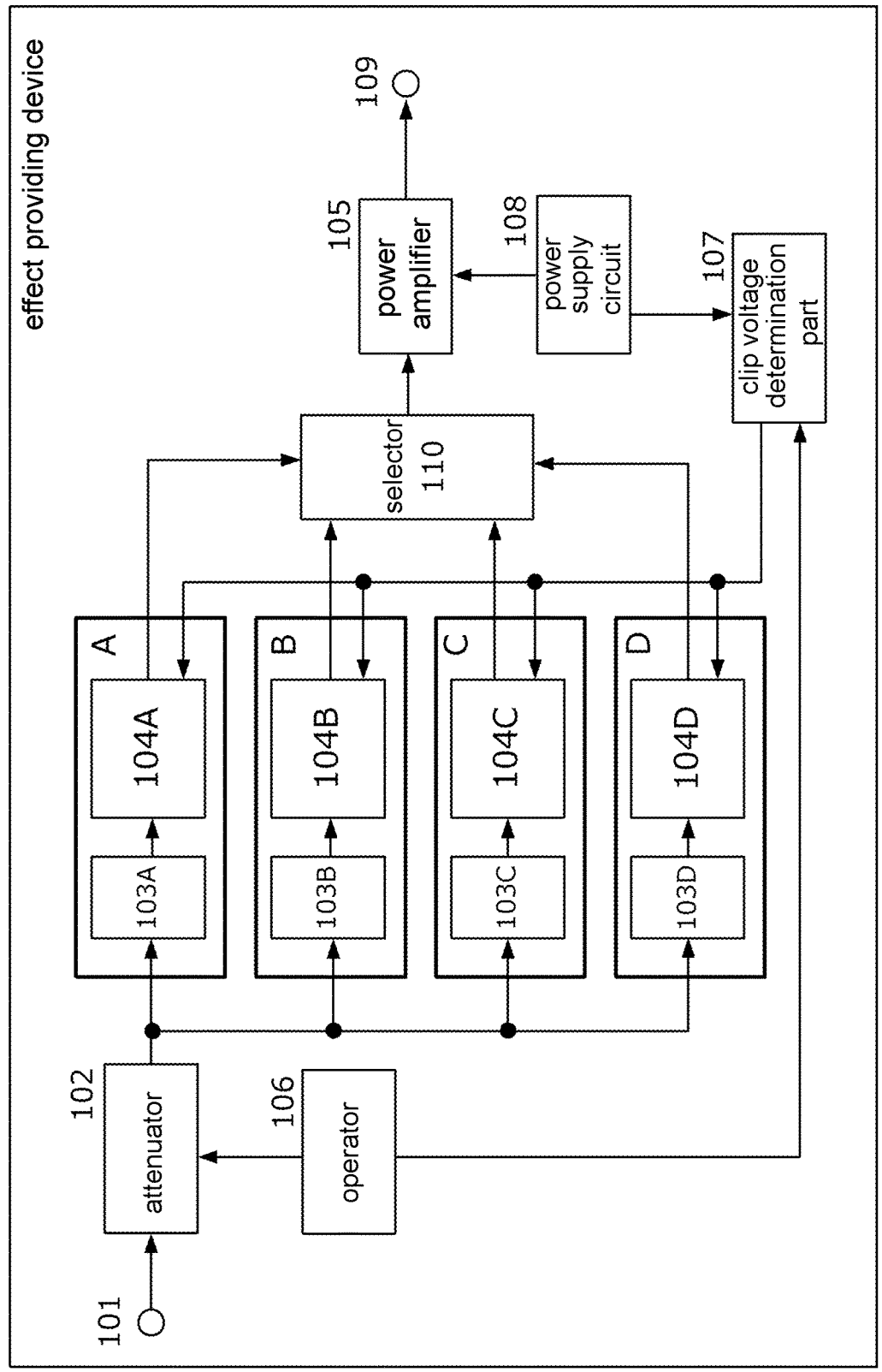
FIG. 2 is a configuration diagram of an effect providing device 10 according to a modified example of the first embodiment.

FIG. 2 illustrates a modified example of the effect providing device 10 according to the embodiment. FIG. 2 illustrates an example when four types A to D of combinations of the preamplifier 103 (shown as 103A to 103D) and the limiting circuit 104 (shown as 104A to 104D) (hereinafter referred to as preamplifier units) are provided. According to such a form, it is possible to switch between vacuum tubes that are simulation targets from a plurality of types (four types in the case of this example). Switching of preamplifier units can be performed through a second operator (selector 110) provided in the device.

Figure 3:
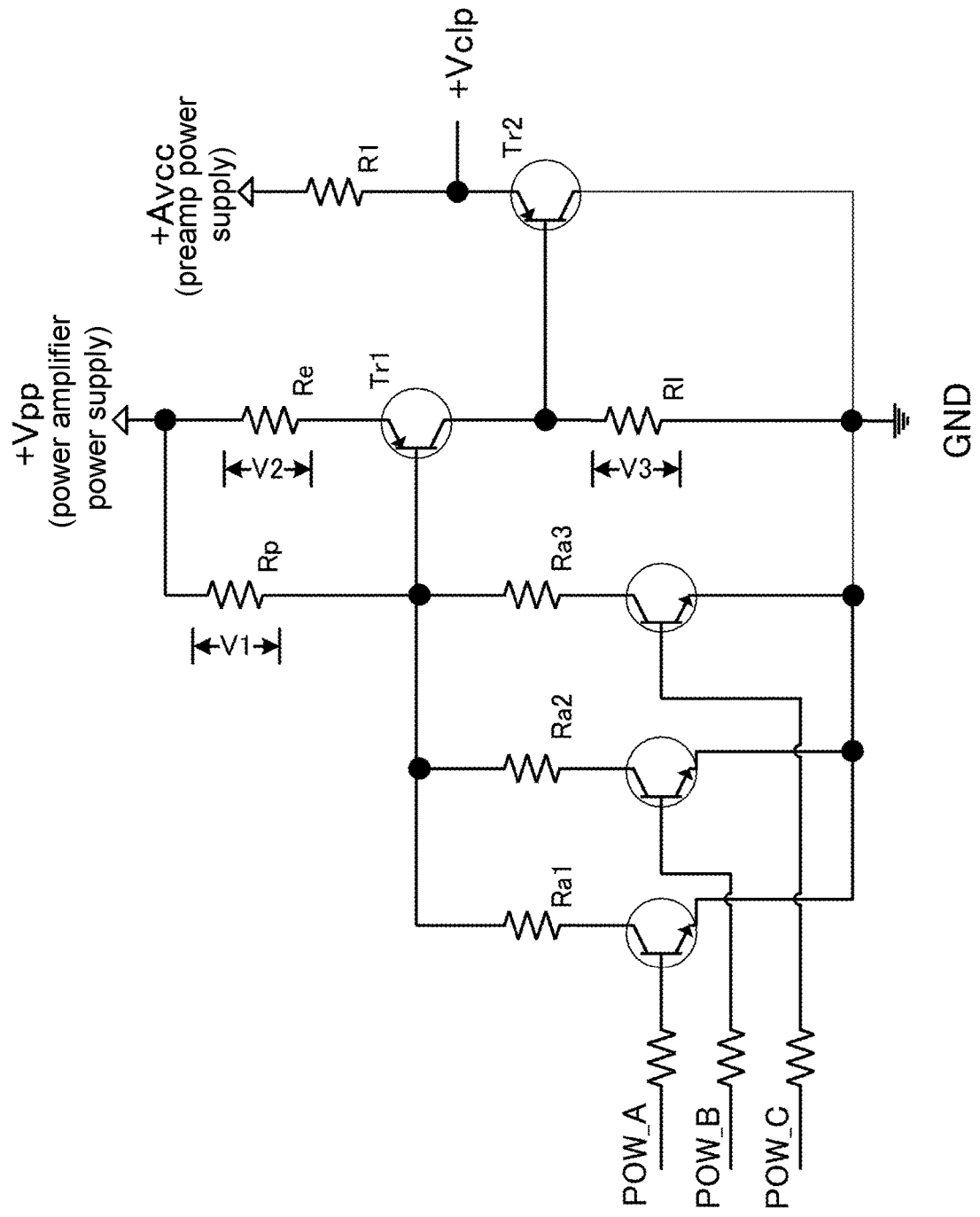
FIG. 3 is a diagram for describing a circuit of a clip voltage determination part.

Next, the clip voltage determination part 107 will be described in detail with reference to FIG. 3. FIG. 3 is a circuit diagram of the clip voltage determination part 107. Although the circuit of FIG. 3 generates a positive voltage as a clip voltage, a negative voltage is also generated using the same circuit. The positive voltage and the negative voltage have the same absolute value.

In the figure, Vpp is a power supply voltage for driving the power amplifier 105. Vpp can be acquired from the power supply circuit 108. Avcc is a stabilized power supply voltage for driving the preamplifier 103. In addition, GND is a reference voltage.

When a user operates the operator 106 to designate power control, a voltage is applied to any of POW_A, POW_B and POW_C. If combined resistances according to Ra1 to Ra3 can be switched between, voltage application patterns are not limited to three types.

Here, when it is assumed that the voltage is applied only to POW_A, a voltage applied to V1 is represented by expression (1). That is, the voltage V1 is a voltage obtained by dividing the power supply voltage Vpp of the power amplifier by Rp/(Ra1+Rp) that is a ratio according to designation of power control.

$$V1=Vpp(Rp/(Ra1+Rp)) \quad \text{Expression (1)}$$

In addition, a voltage applied to V3 is represented by expression (2) because the emitter current and the base current of a transistor Tr1 are almost the same.

$$V3=V2(R1/Re) \quad \text{Expression (2)}$$

Here, expression (3) is established when it is assumed that V1≈V2.

$$V3=Vpp \cdot R1(Rp/Ra1+Rp)) \quad \text{Expression (3)}$$

That is, it is ascertained that the voltage V3 is a voltage obtained by dividing the power supply voltage supplied to the power amplifier by a ratio according to designation of power control. Vclp is a voltage obtained when the voltage V3 is buffered.

A clip voltage (±Vclp) depending on the power control and the power supply voltage (driving voltage) of the power amplifier 105 is generated through the above-described circuit. The generated clip voltage (±Vclp) is input to the limiting circuit 104.

Figure 4:
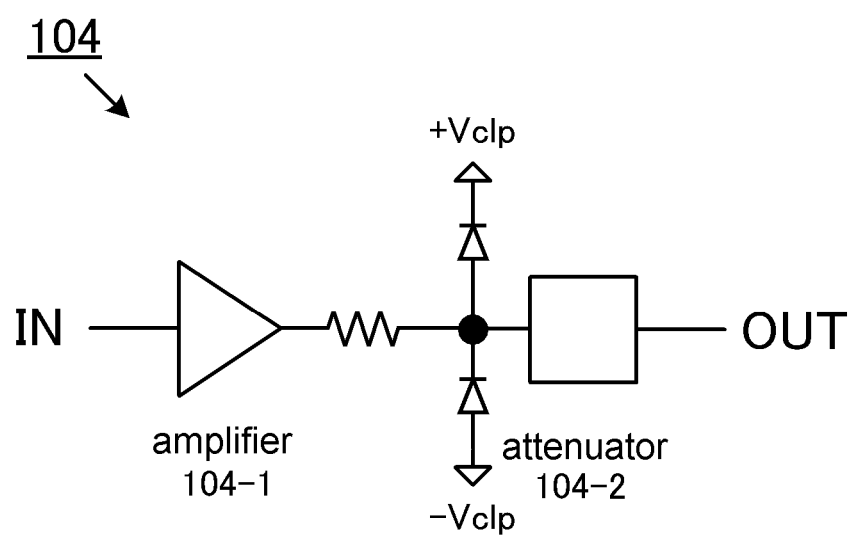
FIG. 4 is a diagram for describing a limiting circuit.

Next, the limiting circuit 104 will be described in detail with reference to FIG. 4. An audio signal output from the preamplifier 103 is input to IN in the figure. The limiting circuit 104 according to the embodiment includes a diode clipper and limits an input signal in response to an applied voltage (i.e., the clip voltage ±Vclp generated by the clip voltage determination part 107). Accordingly, waveforms after clipping which have followed the input clip voltage are output.

Further, in the limiting circuit 104 according to the embodiment, an amplifier 104-1 which amplifies an audio signal before clipping is provided before the diode clipper and an attenuator 104-2 which attenuates an audio signal after clipping is provided after the diode clipper. According to such a configuration, it is possible to add an offset to the clip voltage in response to an amplification factor of the amplifier 104-1 and an attenuation factor of the attenuator 104-2. Accordingly, it is possible to add differences in the head margins of simulated vacuum tubes. It is desirable that the amplification factor and the attenuation factor have values suitable for a vacuum tube that is a simulation target. For example, in the case of the example of FIG. 2, the amplification factor and the attenuation factor are combined differently for each of the limiting circuits 104A to 104D.

As described above, the effect providing device according to the first embodiment clips an audio signal input to a power amplifier using a clip voltage generated on the basis of both power control designated by a user and a power supply voltage supplied to the power amplifier. According to such a configuration, it is possible to obtain the same tone change effect irrespective of details of designation of power control. Furthermore, it is possible to provide a nuance when power supply load varies. Accordingly, it is possible to reproduce dynamic change of distorted sound during overdrive of a vacuum-tube amplifier.

The first amplification part includes an amplifier which performs level control and the like on an input audio signal. The first amplification part may include a circuit which simulates effects of a vacuum-tube amplifier. The second amplification part includes an amplifier (power amplifier) which amplifies an input signal to a level suitable for driving a speaker. The first amplification part temporarily attenuates an input audio signal to a level based on an attenuation factor designated by a user and then amplifies the input audio signal.

In addition, the limiting part is provided between the first amplification part and the second amplification part. The limiting part is a part which limits a voltage of an audio signal input to the second amplification part. That is, the limiting part performs an operation of clipping the voltage of the audio signal input to the second amplification part such that the voltage is equal to or less than a predetermined value.

In the disclosure, a voltage (clip voltage) limited by the limiting part is determined on the basis of an attenuation factor set by a user. Accordingly, an appropriate distortion effect can be obtained irrespective of settings of power control because a clip voltage depending on the attenuation factor set by the user is set.

Further, an attenuation factor may not necessarily be a value representing a magnification (percentage). For example, the attenuation factor may be a value that designates a driving power of a speaker.

Further, the second amplification part may be a power amplifier, and the limiting part may acquire a power supply voltage of the second amplification part and determine the clip voltage additionally on the basis of the power supply voltage in addition to the attenuation factor.

Since the second amplification part is a power amplifier, the power supply voltage thereof may vary according to a load. Accordingly, a more natural distortion effect can be obtained by causing the clip voltage to follow the power supply voltage of the power amplifier in real time.

In addition, the first amplification part may simulate characteristics of a predetermined vacuum tube designated by the user, and the limiting part may correct the clip voltage additionally on the basis of the characteristics of the vacuum tube designated by the user.

For example, an offset may be added to the clip voltage on the basis of the characteristics of the vacuum tube that is a simulation target. Accordingly, it is possible to reproduce differences in head margins (margins between a defined maximum level and actual generation of distortion) of each of vacuum tubes.

In addition, the limiting part may set a voltage obtained by dividing the power supply voltage of the second amplification part by a predetermined ratio based on the attenuation factor as the clip voltage.

According to such a configuration, a value obtained by associating the power supply voltage of the second amplification part with the attenuation factor can be set as the clip voltage.

The disclosure can be identified as a distortion imparting device including at least a part of the aforementioned parts. In addition, the disclosure can also be identified as a distortion imparting method performed by the distortion imparting device. The aforementioned processes and parts can be freely combined and implemented within a range in which technical inconsistency does not occur.

The above-described embodiment is merely an example and the disclosure can be appropriately modified and implemented without departing from the scope of the disclosure.

For example, although a case in which one or four preamplifiers are provided is exemplified in description of the embodiment, a number of preamplifiers other than the exemplified number may be switched between.

What is claimed is:

1. A distortion imparting device comprising:
   a first amplification which attenuates an input audio signal based on an attenuation factor set by a user and amplifies the attenuated input audio signal;
   a second amplification serially connected to the first amplification; and
   a limiting part comprising a limiting circuit which is connected between an output terminal of the first amplification and an input terminal of the second amplification and limits an input voltage of the second amplification to a clip voltage that is predetermined,
   wherein the limiting part further comprises a clip voltage determination part which determines the clip voltage based on the attenuation factor.

2. The distortion imparting device according to claim 1, wherein the second amplification is a power amplifier, and the limiting circuit of the limiting part acquires a power supply voltage of the second amplification and the clip voltage determination part determines the clip voltage additionally based on the power supply voltage in addition to the attenuation factor.

3. The distortion imparting device according to claim 2, wherein the first amplification simulates characteristics of a predetermined vacuum tube designated by the user, and the clip voltage determination part of the limiting part corrects the clip voltage additionally based on the characteristics of the predetermined vacuum tube designated by the user.

4. The distortion imparting device according to claim 2, wherein the clip voltage determination part of the limiting part sets a voltage obtained by dividing the power supply voltage of the second amplification by a predetermined ratio based on the attenuation factor as the clip voltage.

5. The distortion imparting device according to claim 3, wherein the clip voltage determination part of the limiting part sets a voltage obtained by dividing the power supply voltage of the second amplification by a predetermined ratio based on the attenuation factor as the clip voltage.

6. The distortion imparting device according to claim 1, wherein the clip voltage is a reference value and the clip voltage determination part of the limiting part sets a value corrected based on the clip voltage as an actual voltage limiting value.

7. The distortion imparting device according to claim 2, wherein the clip voltage is a reference value and the clip voltage determination part of the limiting part sets a value corrected based on the clip voltage as an actual voltage limiting value.

8. The distortion imparting device according to claim 1, wherein the clip voltage determination part of the limiting part dynamically changes the clip voltage by causing the clip voltage to follow an attenuation amount of an input audio signal.

9. The distortion imparting device according to claim 2, wherein the clip voltage determination part of the limiting part dynamically changes the clip voltage by causing the clip voltage to follow an attenuation factor amount of an input audio signal.

10. A distortion imparting method performed by a distortion imparting device which provides a distortion effect to an audio signal, the distortion imparting method comprising:
    an attenuation step of attenuating an input audio signal based on an attenuation factor set by a user;
    a first amplification step of amplifying the attenuated input audio signal;
    a limiting step of limiting a voltage of the audio signal amplified in the first amplification step to a clip voltage; and
    a second amplification step of amplifying the limited audio signal,
    wherein the clip voltage is determined by using a clip voltage determination part based on the attenuation factor in the limiting step.

11. The distortion imparting method according to claim 10, wherein a power supply voltage for amplifying the limited audio signal is acquired and the clip voltage is determined additionally based on the power supply voltage in addition to the attenuation factor in the second amplification step.

12. The distortion imparting method according to claim 11, wherein characteristics of a predetermined vacuum tube designated by the user are simulated in the second amplification step, and the clip voltage is corrected additionally based on the characteristics of the predetermined vacuum tube designated by the user in the limiting step.

13. The distortion imparting method according to claim 11, wherein a voltage obtained by dividing the power supply voltage for amplifying the limited audio signal by a predetermined ratio based on the attenuation factor is set as the clip voltage in the limiting step.

14. The distortion imparting method according to claim 12, wherein a voltage obtained by dividing the power supply voltage for amplifying the limited audio signal by a predetermined ratio based on the attenuation factor is set as the clip voltage in the limiting step.

15. The distortion imparting method according to claim 10, wherein the clip voltage is a reference value, and a value corrected based on the clip voltage is set as an actual voltage limiting value in the limiting step.

16. The distortion imparting method according to claim 11, wherein the clip voltage is a reference value, and a value corrected based on the clip voltage is set as an actual voltage limiting value in the limiting step.

17. The distortion imparting method according to claim 10, wherein the clip voltage is dynamically changed by being caused to follow an attenuation amount of an input audio signal in the limiting step.

18. The distortion imparting method according to claim 11, wherein the clip voltage is dynamically changed by being caused to follow an attenuation amount of an input audio signal in the limiting step.

* * * * *